(12) United States Patent
Kanauchi

(10) Patent No.: US 6,359,646 B1
(45) Date of Patent: Mar. 19, 2002

(54) PART MOUNTING DEVICE

(75) Inventor: Noboru Kanauchi, Yamagata (JP)

(73) Assignee: Yamagata Casio Co., Ltd., Yamagata (JP)

( * ) Notice: Subject to any disclaimer, the term of this patent is extended or adjusted under 35 U.S.C. 154(b) by 0 days.

(21) Appl. No.: 09/233,371

(22) Filed: Jan. 19, 1999

(30) Foreign Application Priority Data

Apr. 6, 1998 (JP) .......................................... 10-093726

(51) Int. Cl.[7] ................................................. H04N 7/18
(52) U.S. Cl. ............................ 348/87; 348/91; 348/94; 348/95
(58) Field of Search ............................... 348/86–87, 91, 348/92, 94, 95, 125, 126, 129; 382/141, 145, 151

(56) References Cited

U.S. PATENT DOCUMENTS

| 5,381,508 A | * | 1/1995 | Krumenacher | .............. | 385/147 |
| 5,541,834 A | * | 7/1996 | Tomigashi et al. | ...... | 364/167.05 |
| 5,854,745 A | * | 12/1998 | Muraoka et al. | ....... | 364/167.04 |

FOREIGN PATENT DOCUMENTS

| JP | 4-31802 | | 2/1992 | | |
| JP | 4-165309 | | 6/1992 | | |
| JP | 5-51298 | | 8/1993 | | |
| JP | 6-112690 | * | 4/1994 | .......... | H05K/13/04 |
| JP | 10-145094 | * | 5/1998 | ............ | B25J/15/06 |

* cited by examiner

*Primary Examiner*—Vu Le
(74) *Attorney, Agent, or Firm*—Frishauf, Holtz, Goodman, Langer & Chick, P.C.

(57) ABSTRACT

The present invention aims at providing a part mounting device for efficiently performing mounting operations by eliminating an amount of time required for moving and stoppage intended for recognizing an image of a part. In the part mounting device according to the present invention, an image recognizing device included in a working tower together with a mounting head comprises an optical fiber, a beam splitter arranged at the top of the optical fiber, and an image recognizing camera arranged at the top of the beam splitter. The image recognizing device further comprises an illumination light source at the side of the beam splitter. A nozzle shaft of the mounting head is arranged by being loosely inserted into a lower portion of the optical fiber. An irradiation light from the illumination light source irradiates a part which is picked up by the picking-up nozzle attached to the tip of the nozzle shaft via the beam splitter and the optical fiber. The reflected light is propagated through the optical fiber in the direction reverse to the irradiation direction. The light which has passed through the beam splitter is formed into an image by the image recognizing camera. This image signal is analyzed by a central controlling unit, so that any position deviation of the part is detected and the position is corrected. As described above, an image of a picked up part is recognized also on a working tower side by combining the optical fiber and the nozzle shaft, which can be arbitrarily inserted. Therefore, the mounting head picks up all parts other than a uniquely-shaped part from a part supplying unit, and the image recognizing process can be performed while the mounting head is moving the picked up part directly to the part mounting position on a board. As a result, the mounting head can mount almost all the parts directly on the board without moving the parts to the position of an image recognizing camera which is arranged on a chassis side and is intended for recognizing an image of a part, thereby increasing the efficiency of the part mounting process.

6 Claims, 3 Drawing Sheets

PART MOUNTING DEVICE

BACKGROUND OF THE INVENTION

1. Field of the Invention

The present invention relates to a part mounting device for automatically mounting electronic parts on a printed circuit board while correcting the positions of the electronic parts.

2. Description of the Related Art

Conventionally, there was a part mounting device for mounting a number of integrated circuit-type electronic parts (simply referred to as parts hereinafter) such as an IC, a resistor, a condenser, etc. on a printed circuit board (simply referred to as a board hereinafter). This part mounting device comprises a mounting head which can move upward and downward and is attached to a working tower which can move to the right and left and back and forth, picks up a part from a part supplying device with a picking-up nozzle of the mounting head, and mounts the picked up part at a mounting position on the board, which is specified by a parameter of a mounting process program.

At this time, the position of the part picked up by the picking-up nozzle (the attitude or the orientation of the picked up part) is not fixed. Therefore, the picking-up state of the part is examined, a deviation from the center of the picking-up position, the rotational state of the picking-up attitude, etc. are examined, and the position is corrected in order to correctly mount the part at the assigned position on the board based on the results of the examinations.

FIG. 1 is a side view exemplifying the configuration of such a conventional part mounting device. A part mounting device 1 shown in this figure is in a state where a mounting head 2 attached to a working tower (not shown) picks up each part 5 supplied from a part supplying unit 4 by using a picking-up nozzle 3, moves along a moving route indicated by a broken line arrow A, and stops so that a part recognizing device can recognize an image of a picked up part in order to correctly mount the part on a board 6.

An illuminating device 7 of the part recognizing device illuminates the part 5 from below, and an image recognizing camera 8 of the part recognizing device captures the image of the part 5. This image information is transmitted to a controlling unit via a signal cable. The controlling unit processes the captured image of the part 5, compares the processed image with required image data, and calculates the correction values of the position at which the mounting head 2 must stop over the board 6 and of the angle to which the picking-up nozzle 3 must rotate based on the results of the comparison.

The above described board 6 is conveyed into the part mounting device 1 along board guide rails 9, and is supported from below with pins 13 of a support plate 12 which is raised by a raising/lowering device 11. Its exact position is determined with a position determining pin 14, and the board 6 is fixed to the board guide rails 9. The mounting head 2 mounts the part 5 at the required mounting position on the fixed board 6, and the position of the part 5 is properly determined as described above based on the calculated correction values.

To capture the image of the part 5 with the image recognizing camera 8 as described above is an essential step for performing image recognition. Especially, since the arrangement density of lead wires and bumps of a part has become high in recent years with the advances in part manufacturing techniques, the above described step for recognizing an image of a part with an image recognizing camera become more and more important in order to correctly connect the electrode-terminal of the part to the printed wiring on the board 6, that is, to mount the part, the step of recognizing the image of a part with an image recognizing camera becomes more and more important. However, the mounting head must move to and stop at the position at which the image recognizing camera for capturing the image of a part is arranged, after it picks up the part.

Therefore, the amount of time required for moving and stoppage for each part is accumulated by the number of parts mounted on one board, and the accumulated amount of time will become of significant amount such that it cannot be ignored in a total amount of operation time. This is a principal factor which prevents an improvement of the efficiency of part mounting operations, that is, the improvement of the productivity of board units.

SUMMARY OF THE INVENTION

The present invention was developed in the above described background, and aims at providing a part mounting device for efficiently performing part mounting operations without an amount of time required for moving and stopping in order to recognize an image of a part. To achieve this aim, a working tower of the part mounting device according to the present invention comprises: an image transmitting unit which is configured by an optical waveguide composed of an optical fiber bundle intended for transmitting an image of an electronic part picked up by a picking-up nozzle, and is attached to the working tower; an image recognizing camera for capturing the image of the electronic part transmitted by the image transmitting unit; and a flexible cable for transferring the image captured by the image recognizing camera to a controlling unit. The electronic part is picked up from a part supplying device with the picking-up nozzle which can be attached/detached to/from a nozzle shaft of a mounting head of the working tower. The image of the picked up part is then captured with the image recognizing camera while the part is being moved to a mounting position, and the captured image is transferred to the controlling unit. The controlling unit recognizes the captured image, corrects the mounting position of the electronic part based on the results of the recognition, and controls the working tower in order to mount the electronic part at the proper position based on the correction values.

Additionally, this part mounting device may further comprise a part illuminating unit for illuminating the electronic part picked up by the picking-up nozzle via the optical waveguide; and an image recognizing camera which is different from the image recognizing camera 8 used in order to capture the image of the electronic part picked up by the picking-up nozzle on the route along which the working tower moves. The image transmitting unit and the illuminating unit are configured by sharing the optical waveguide, for example, via a beam splitter. The nozzle shaft is arranged, for example, by being inserted into an insertion hole arranged close to an entry point of the image transmission path of the image of the electronic part within the optical waveguide. Furthermore, the image recognizing camera is configured to also detect a mark indicating the position of the printed circuit board, which is transmitted, for example, via the optical waveguide.

DESCRIPTION OF THE PREFERRED EMBODIMENT

Figure 1:
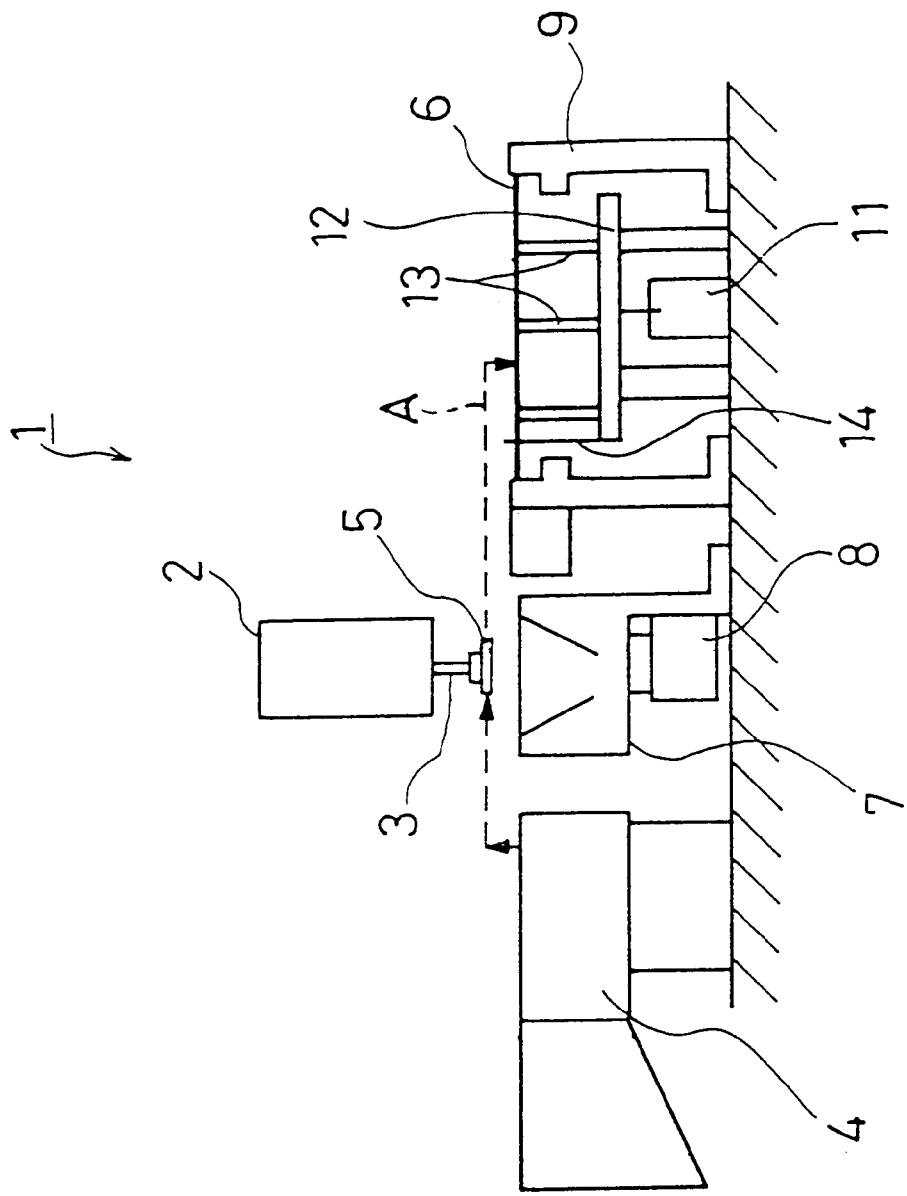
FIG. 1 is a side view exemplifying the configuration of a conventional part mounting device.

Provided below is the explanation about a preferred embodiment according to the present invention, by referring to the drawings.

Figure 2:
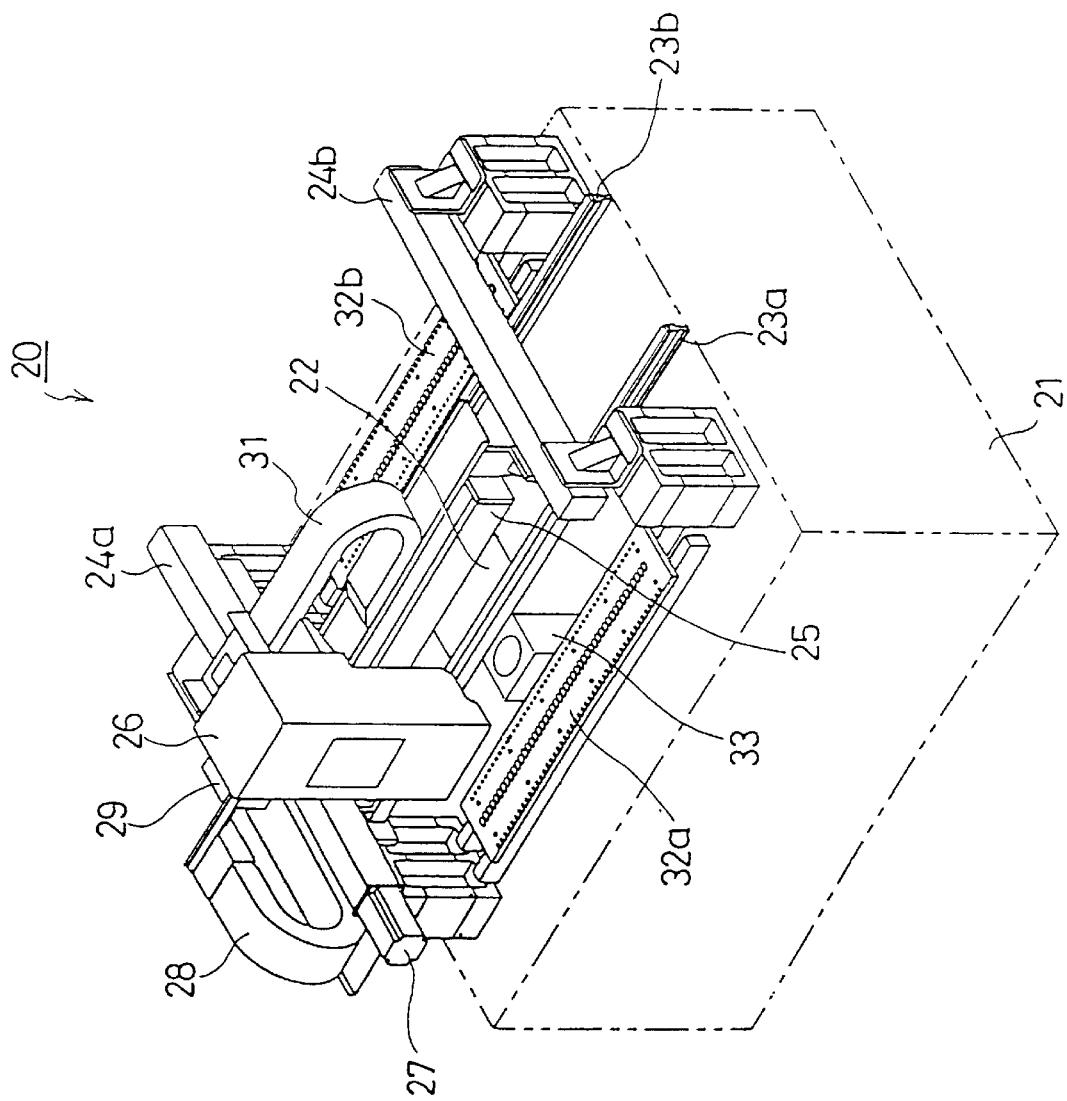
FIG. 2 is a view shows a part mounting device according to a preferred embodiment of the present invention.

FIG. 2 is a view shows a part mounting device according to the preferred embodiment of the present invention. In this figure, the part mounting device is illustrated by taking off a protection cover which normally covers almost the whole of the device. As shown in this figure, various types of devices are arranged inside and mounted onto a chassis 21 of a part mounting device 20. The chassis 21 includes units such as a central controlling unit for controlling respective units, etc. An input device composed of a liquid crystal display, a touch panel, etc. is arranged at the front of the protection cover, not shown. Various instructions are input to the input device via such external input devices.

A pair of parallel board guide rails 23a and 23b, one of which is fixed and the other of which is movable, is arranged in the center of the chassis 21 in the direction in which the board 22 is conveyed (the X axis direction from the lower right to the upper left shown in FIG. 2). A plurality of loop-shaped conveyer belts are arranged directly under the board guide rails 23a and 23b so that they can move a board, although they are not shown in this figure. Side portions of several-millimeters width of each of the plurality of conveyer belts appear beneath the board guide rails 23a and 23b along the board conveying path. Each of the plurality of conveyer belts is driven by a belt-driving motor, moves in a board conveying direction, and carries a board while supporting both sides of the rear of the board.

A pair of rails 24a and 24b fixed in parallel (Y axis rails) is arranged in the direction perpendicular to the board conveying direction (the X axis direction). A long movable rail (X axis rail) 25 is engaged with the Y axis rails 24a and 24b so that the rail can freely slide. A working tower 26 for mounting parts on the board 22 is attached to the X axis rail 25 so that it can freely move. The working tower 26 comprises a mounting head attached with a picking-up nozzle and an image recognizing device, which will be described in detail later.

A Y axis driving servo motor 27 is attached to the fixed rail 24a. The Y axis driving servo motor 27 drives in the forward and reverse directions according to instructions issued from the central controlling unit. With this motor, the X axis rail 25 moves forward and backward (in the Y axis direction) along the Y axis rails 24a and 24b via a driving transmission system. The fixed rail 24a and the X axis rail 25 are connected with a flexible cable 28.

Additionally, an X axis direction driving servo motor 29 is attached to the X axis rail, and drives in the forward and reverse directions according to instructions issued from the central controlling unit. With this motor, the working tower 26 freely moves to the right and left (in the X axis direction) along the X axis rail 25. The X axis rail 25 and the working tower 26 are connected with a flexible cable 31. The working tower 26 is connected to the central controlling unit with the cables 28 and 31. Electric power and control signals are provided from the central controlling unit via the cables 28 and 31. Furthermore, image recognition data (image data) obtained by capturing the image of a part being picked up is transmitted from the working tower 26 to the central controlling unit.

Part cassette boards 32a and 32b are respectively arranged at the front and the rear of the chassis 21. A part recognizing device 33 which comprises an illuminator and a camera are securely disposed between the part cassette board 32a in the front and the fixed board guide rail 23a. This part recognizing device 33 is intended for recognizing the image of a special-purpose part or a large-size part, etc. that the image recognizing device included in the working tower 26 has difficulty in recognizing.

On the board conveying path between the board guide rails 23a and 23b, a board support plate similar to the support plate 12 shown in FIG. 1 is arranged. This board support plate supports the board 22 which is conveyed from a device at the preceding production stage along the board guide rails 23a and 23b with the conveyer belt, by raising the board 22 from underneath, and determines the position of the board 22 by inserting a position determining pin into a position determining hole of the board.

Part tape cassettes which are attachable/detachable and respectively correspond to a plurality of types of parts to be mounted on the board 22 are attached to the part cassette boards 32a and 32b beforehand, although they are not shown in this figure. Additionally, a nozzle replacing device is arranged at a suitable position outside the board guide rail 23a or 23b, although this is not shown. The nozzle replacing device includes a plurality of picking-up nozzles. The plurality of picking-up nozzles having different tip sizes and shapes are determined beforehand in correspondence with the parts to be mounted on the board 22.

The mounting head for picking up and mounting a part is attached to the working tower 26 so that it can freely move upward and downward. The mounting head comprises a nozzle shaft which is linked to a vacuum device (not shown) and will be described later, and an arbitrarily attachable/detachable picking-up nozzle is attached to the tip of the nozzle shaft. With the attached nozzle, the mounting head picks up a desired part from the part tape cassette on the part cassette board 32a (or 32b), and mounts the picked up part on the board 22.

Figures 3A, 3B:
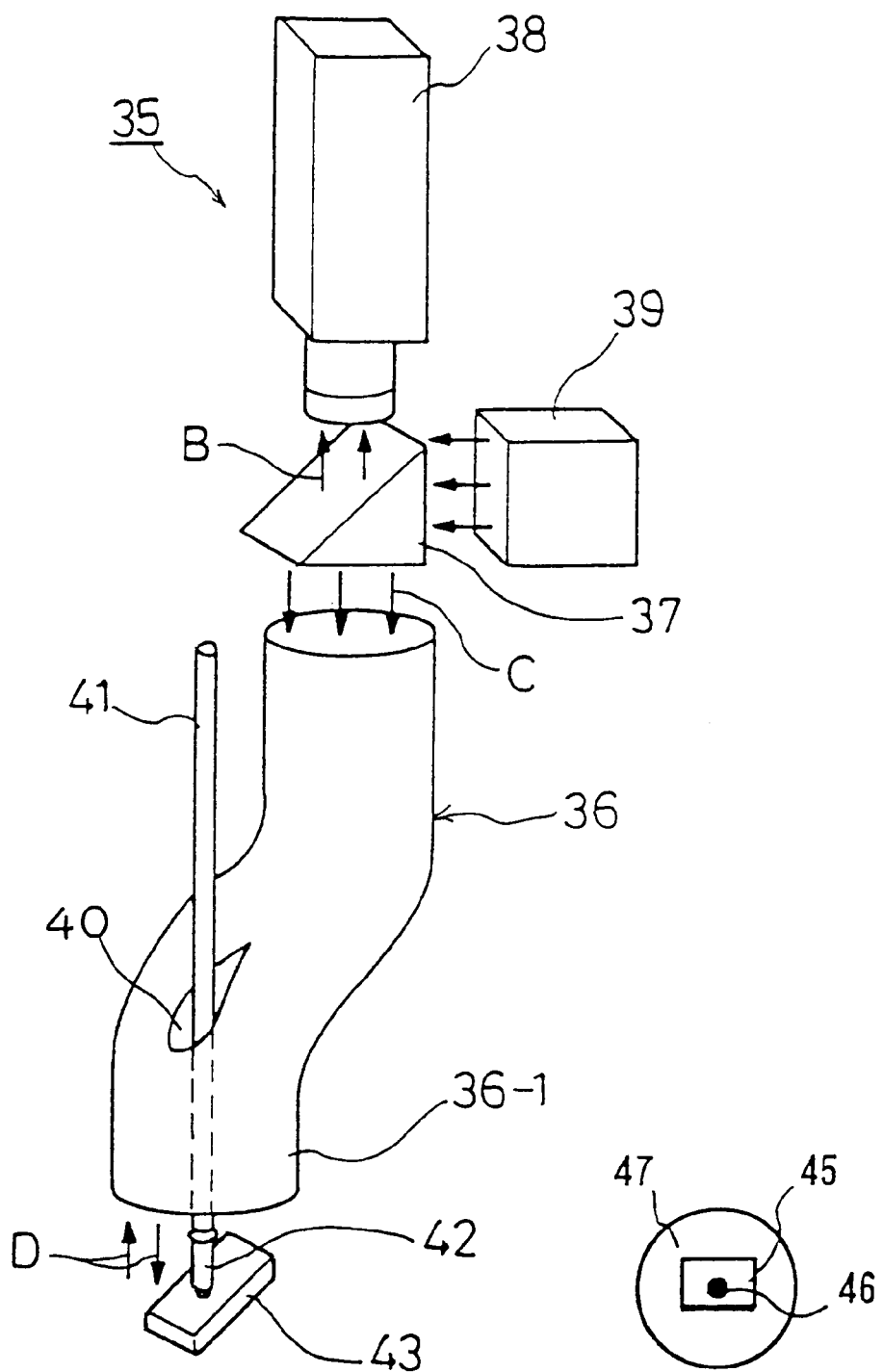
FIG. 3A is a view shows the configuration of an image recognizing device included in a working tower of the part mounting device.
FIG. 3B shows an image captured by the image recognizing device.

FIG. 3A is a view shows the configuration of the image recognizing device included in the working tower 26, while FIG. 3B shows an image recognized by the image recognizing device. The image recognizing device 35 comprises an optical fiber bundle 36 forming an optical waveguide, and an image recognizing camera 38 for capturing an image which is transmitted upward from the optical fiber bundle 36, and which is output via a beam splitter 37 composed of a prism, as indicated by arrows B.

Additionally, the image recognizing device 35 comprises an illumination light source 39, which includes a light source for inputting irradiation light from the light source to the optical fiber bundle 36 via the beam splitter 37 as indicated by arrows C shown in this figure, for propagating the input light to the bottom of the optical fiber bundle 36, and for outputting the light from the end of the optical fiber bundle 36.

An insertion hole 40 is arranged inside the optical waveguide, in a lower part 36-1 of the optical fiber bundle 36. A nozzle shaft 41 of the mounting head (not shown) is arranged to be loosely inserted through the insertion hole 40.

An attachable/detachable picking-up nozzle 42 is attached to the tip of the nozzle shaft 41. A part 43 is picked up by the attached picking-up nozzle 42. The irradiation light which is output from the illumination light source 39 is reflected by the beam splitter 37, and is input to the optical fiber bundle 36. This light then propagates downward through the optical waveguide of the optical fiber bundle 36, and irradiates the part 43 as an illumination light.

The reflected illumination light, which is reflected by the part picked up by the picking-up nozzle 42, propagates back through the optical waveguide of the optical fiber bundle 36 in the direction reverse to the irradiation direction, and enters the beam splitter 37. This light enters the image recognizing camera 38, and an image 45 of the part 43 is formed by an image receiving unit as shown in FIG. 3B. Note that the insertion hole projects a shadow 46 on the image 45 as shown in FIG. 3B.

The image signal of the part 43, which is captured by the image recognizing camera 38, is transmitted to the central controlling unit via the cables 28 and 31 (refer to FIG. 2). The central controlling unit analyzes this image signal, detects any position deviation of the part, calculates correction values according to the detected position deviation, and transmits the calculated correction values to the working tower.

During this period, the working tower supporting the mounting head of the nozzle shaft 41 takes the shortest route from the position at which the part is picked up to the position at which the part is to be mounted on the board without interruption, and mounts the part 43 at the required position on the board 22 according to the correction values transmitted from the central controlling unit.

The image recognizing device 35 of the mounting head may also detect a mark such as an eye-mark, etc., which is not shown, at the mounting position on the board 22, and recognizes a proper position on the board 22 based on the detected mark.

Furthermore, a suitable optical system, for example, composed of a plurality of lenses, may be attached to the end of the optical fiber bundle 36, although this is not particularly referred to in the above described preferred embodiment.

What is claimed is:

1. A part mounting device where an arbitrarily attachable/detachable picking-up nozzle is attached to a nozzle shaft of a mounting head of a working tower, an electronic part is picked up with the picking-up nozzle from a part supplying device, an image of the electronic part is recognized, a controlling unit for calculating correction values of a mounting position of the electronic part based on a recognition result is included, and the electronic part is automatically mounted on a printed circuit board based on the correction values from the controlling unit, the working tower comprising:

an optical waveguide composed of an optical fiber;

image transmitting means for transmitting an image of an electronic part picked up by the picking-up nozzle via the optical waveguide; and an image recognizing means for capturing the image of the electronic part, which is transmitted by said image transmitting means.

2. The part mounting device according to claim 1, further comprising:

part illuminating means for illuminating the electronic part picked up by the picking-up nozzle via the optical waveguide.

3. The part mounting device according to claim 2, wherein said image transmitting means and said illuminating means share the same optical waveguide via a beam splitter.

4. The part mounting device according to claim 1, wherein the nozzle shaft is arranged by being inserted into an insertion hole which is arranged close to an entry point of an image transmission path of the image of the electronic part within the optical waveguide.

5. The part mounting device according to claim 1, wherein said image recognizing camera also detects a mark indicating a position of the printed circuit board, which is transmitted via the optical waveguide.

6. The part mounting device according to claim 1, further comprising:

an image recognizing camera which is different from said image recognizing camera 8 used in order to capture the image of the electronic part picked up by the picking-up nozzle on a route along which the working tower moves.

* * * * *